(12) United States Patent
Ichida et al.

(10) Patent No.: US 10,218,340 B2
(45) Date of Patent: *Feb. 26, 2019

(54) ADJUSTABLE DELAY CIRCUIT FOR OPTIMIZING TIMING MARGIN

(71) Applicant: Micron Technology, Inc., Boise, ID (US)

(72) Inventors: Hideyuki Ichida, Yokohama (JP); Raghukiran Sreeramaneni, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/853,553

(22) Filed: Dec. 22, 2017

(65) Prior Publication Data

US 2018/0123573 A1    May 3, 2018

Related U.S. Application Data

(63) Continuation of application No. 14/848,954, filed on Sep. 9, 2015, now Pat. No. 9,941,870.

(51) Int. Cl.
| | |
|---|---|
| *H03K 5/134* | (2014.01) |
| *G11C 11/4076* | (2006.01) |
| *G11C 7/10* | (2006.01) |
| *G11C 11/4093* | (2006.01) |
| *H03K 5/00* | (2006.01) |

(52) U.S. Cl.
CPC ............ *H03K 5/134* (2014.07); *G11C 7/1093* (2013.01); *G11C 11/4076* (2013.01); *G11C 11/4093* (2013.01); *G11C 7/1066* (2013.01); *H03K 2005/00052* (2013.01)

(58) Field of Classification Search
CPC combination set(s) only.
See application file for complete search history.

(56) References Cited

U.S. PATENT DOCUMENTS

| | | | |
|---|---|---|---|
| 5,518,400 A | 5/1996 | Otoide et al. | |
| 6,163,194 A | 12/2000 | Truong et al. | |
| 6,255,879 B1 | 7/2001 | Voss | |
| 6,707,496 B1 | 3/2004 | Yang et al. | |
| 6,803,877 B2 | 10/2004 | Ludewig et al. | |
| 7,221,214 B2 | 5/2007 | Santou | |
| 7,573,970 B2 | 8/2009 | Hasegawa et al. | |
| 9,941,870 B2 | 4/2018 | Ichida et al. | |
| 2017/0070219 A1 | 3/2017 | Ichida et al. | |

FOREIGN PATENT DOCUMENTS

JP    2005-151203    6/2005

*Primary Examiner* — An T Luu
(74) *Attorney, Agent, or Firm* — Dorsey & Whitney LLP (57) ABSTRACT

The present invention relates to timing margin adjustment circuits using adjustable delay circuits. An example adjustable delay circuit may include a signal line, an output circuit, and a plurality of delay circuits. Each of the plurality of delay circuits may be configured to provide respective delay amounts that are different from each other, and where a first one of the plurality of delay circuits, which may be arranged most adjacently to the output circuit, being smaller in delay amount than other ones of the plurality of delay circuits. Each of the plurality of delay circuits may include an input node and an output node, and a selected one of the plurality of delay circuits connected at its input node to the signal line and at its output node to the output circuit, the rest of the plurality of delay circuits being disconnected from the signal line and the output circuit.

20 Claims, 7 Drawing Sheets

ADJUSTABLE DELAY CIRCUIT FOR OPTIMIZING TIMING MARGIN

CROSS-REFERENCE TO RELATED APPLICATION(S

This application is a continuation of U.S. patent application Ser. No. 14/848,954, filed Sep. 9, 2015 and issued as U.S. Pat. No. 9,941,870 on Apr. 10, 2018. The aforementioned application and issued patent are incorporated herein by reference, in their entirety, for any purpose.

BACKGROUND

Data is conventionally provided by a host system, and may conventionally be received on data input pins. For a memory to know when to capture data, the host system may provide a strobe signal, which may cause the memory to capture the data on the input pins. The timing of the strobe signal with respect to the arrival of the data signals may be an important parameter, and may be set to ensure data is captured at a time when the data on the input pins is valid. Valid data may be data that has fully transitioned to a voltage level indicative of a logic state, e.g., a high or low logic state. If, for example, data is captured at a time when it has yet to fully transition, the data stored may not be valid, and an incorrect logic level may be captured and stored. Additionally, the data may only be valid for a limited amount of time. The limited amount of time the data is valid may be referred to as a timing window. Thus, it may be desirable to have the data strobe signal occur, for example, in the middle of the timing window. The difference in timing between the arrival of the data, e.g., the hold time, and the arrival of the strobe signal, e.g., the setup time, may be the timing margin. This is sometimes referred to as the setup/hold time.

The timing margin, however, may become more sensitive for memories operating at low voltages and at high operating speeds. This may be an issue because the margin is much smaller due to the higher operating speeds and the low voltage is more difficult to detect. The low voltages may be more difficult to detect, e.g., discern the intended logic state from, due to the voltage difference between a high and low logic state being small. As such, it may be important to provide enough time for the data signals to fully transition before capturing the data. Additionally, the timing margin may be affected by internal operating parameters of the memory, which may cause the timing margin to drift, resulting in problems related to data capture from an external bus.

DETAILED DESCRIPTION OF PREFERRED EMBODIMENTS

Apparatuses and methods for adjustable delay circuits for optimizing timing margin are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As discussed above, a timing margin for capturing data by a memory may be a sensitive parameter at high operating speeds and low operating voltages. As such, memories may be fabricated to provide a desired timing margin. For example, an input/output (IO) circuit of a memory, which may receive the data (e.g., write data) and the data strobe signal, may be configured to provide the desired timing margin. However, due to variations in internal operating voltages, a desired timing margin may not be actually obtained during operation. As such, a technique to alter the timing margin during fabrication of a memory may be desired.

One solution may be to include an adjustable delay circuit in an IO circuit. The adjustable delay circuit may be adjusted during fabrication by altering a propagation path of a data strobe signal, a data signal, or combinations thereof, between respective input pins and one or more IO circuits configured to capture the data. The data strobe signal may cause the data to be captured by the one or more IO circuits. The adjustable delay circuit may include a plurality of delay unit circuits, with each of the plurality of delay unit circuits having a different delay amount. Thus, by altering internal connections of the adjustable delay circuit to cause a respective signal, data strobe or data, to propagate through a selected one of the delay unit circuits, a selected delay amount may be provided to the signal, thus, adjusting the timing margin to the desired timing margin.

Additionally, the adjustable delay circuit may also be characterized by having an improved high frequency operation since the delay unit circuits are completely switched, instead of simply adding delay elements onto an existing delay circuit. For example, each of the delay unit circuits may be substantially similar other than providing a different, unique delay amount. Further, each of the delay unit circuits may be formed from a minimum number of components so that the frequency response of the delay units may be substantially similar. Thus, an RC effect of each of the delay unit circuits may be similar so that there may be no degradation in the frequency response of the adjustable delay circuit when the amount of delay is changed by switching to a different delay unit circuit.

Figure 1:
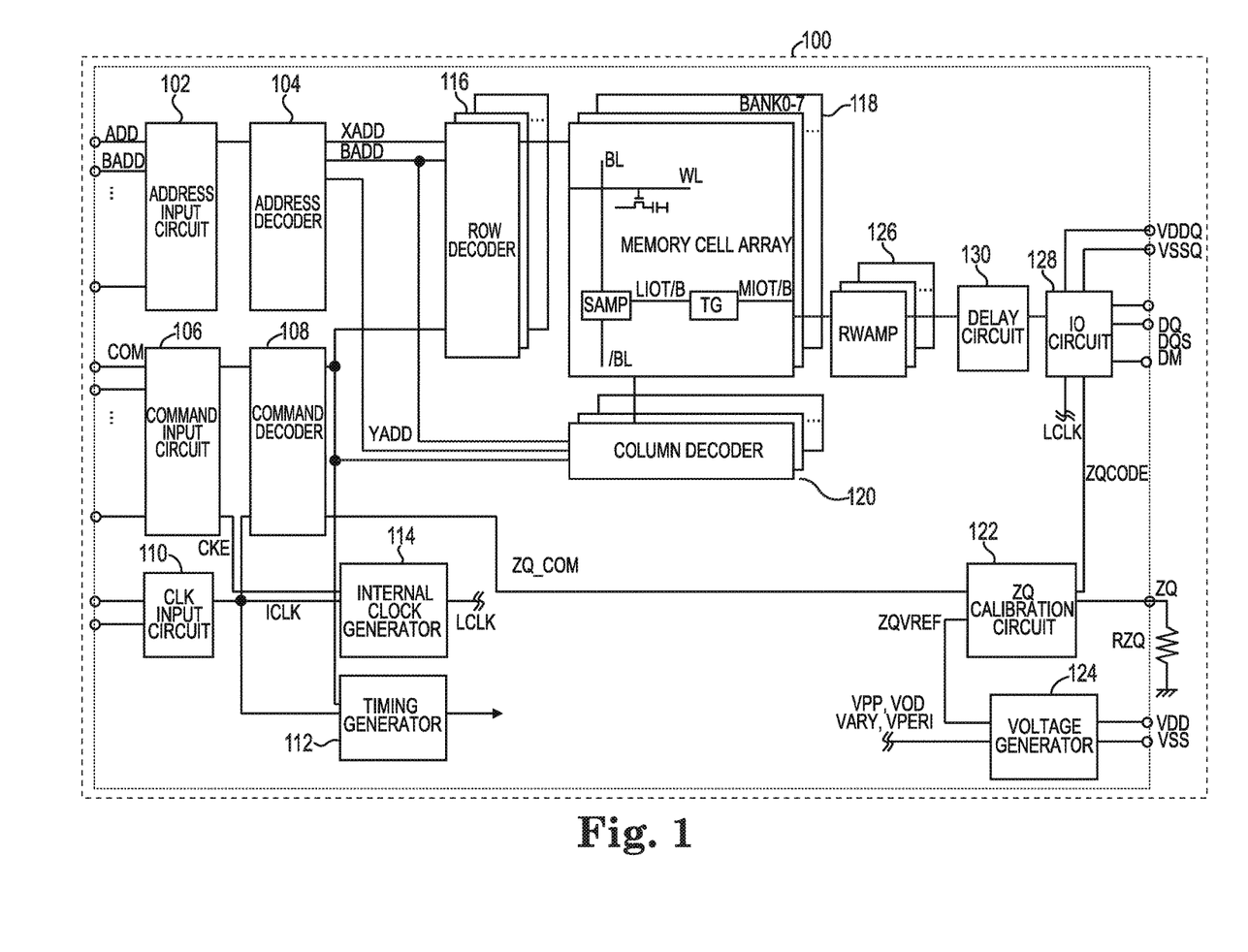
FIG. 1 is a bock diagram of a memory according to an embodiment of the present disclosure.

FIG. 1 is a bock diagram of a memory 100 according to an embodiment of the present disclosure. The memory 100 may be a volatile memory, such as dynamic random access memory (DRAM) in either a synchronous or an asynchronous variation, double data rate DRAM, and etc. The memory 100 may include, but is not limited to, a plurality of memory banks 118, with each memory bank of the plurality of memory banks 118 including a cell array. Each cell array may include a plurality of word lines WL, a plurality of bit lines BL, and an array of memory cells, as is known in the art.

An address input circuit 102 receives address information and, in response, provides the address information to an address decoder 104. The address decoder 104 may decode the address to provide control signals XADD and BADD to a row decoder 116 and a control signal YADD to a column decoder 120. A command input circuit 106 receives command information and, in response, provides the command information to a command decoder 108. The command decoder 108 may decode the command information and provide control signals to the row decoder 116 and the column decoder 120.

The row decoder 116 and the column decoder 120, based on the control signals received from the address decoder 104 and the command decoder 108, may provide activation signals to various word lines and bit lines included in one or more of the plurality of banks 118. The activation of the word lines and bit lines, depending on command type, may cause bits of data to be read from or written to the memory cells associated with the activated word lines and bit lines.

A clock input circuit 110 may receive a clock signal and, in response, provide a clock signal ICLK to the command decoder 108, an internal clock generator 114, and a timing generator 112. The internal clock generator 114 may additionally receive a control signal from the command input circuit 106. The internal clock generator 114, in response to receiving the clock signal from the clock input circuit 110 and the control signal from the command input circuit 106, may provide one or more internal clock signals LCLK to the various circuits of the memory 100. The timing generator 112, in response to receiving the ICLK signal, may provide timing control signals to the various circuits of the memory 100 for timing the operation of memory commands so that read/write data are provided/captured at respective target times.

A ZQ calibration circuit 122 may be coupled to an external resistor RZQ, which may act as a reference impedance for the ZQ calibration circuit 122. The ZQ calibration circuit 122 may perform calibration operations with reference to the impedance of the external resistor, and further in reference to the reference potential ZQVREF provided by a voltage generator 124. Upon the ZQ calibration circuit 122 being activated by a ZQ_com command provided by the command decoder 108, the ZQ calibration circuit 122 may provide an impedance code ZQCODE to the IO circuit 128. The impedance code may adjust an impedance of one or more output buffers of IO circuit 128. The voltage generator 124 may receive one or more power supply voltages, such as VDD and VSS, and generate one or more internal reference voltages in response, such as VARY, VPP, VOD, VPERI, and the reference voltage ZQVREF. The internal potential VPP may be used by the row decoder 116, the internal potentials VOD and VARY may be used in sense amplifiers included in the plurality of memory banks 118, such as the sense amplifier SAMP, and the internal potential VPERI may be used in many other circuits of the memory 100.

The IO circuit 128 may receive data and provide data in response to write and read operations, respectively. Data may be received/provided via data pins DQ and data strobe signals may be received/provided by the data strobe pin DQS. The IO circuit 128 may further receive power supply voltages VDDQ and VSSQ, which may be similar in voltage level to the power supply voltages VDD and VSS. In response to a write operation, the IO circuit 128 may receive data on the data pins DQ and latch the data in response to a data strobe signal received on the data strobe pin DQS. The relative timing between receiving data on the data pins DQ and receiving the strobe signal on the data strobe pin DQS may affect the validity of the data received, for example. The relative timing between the two, as noted above, may be the timing margin. The memory 100 may be designed for a desired timing margin, but the actual timing margin may be different after fabrication for various reasons, such as variation in one or more internal voltages provided by the voltage generator 124. The timing margin may be determined during wafer fabrication and one or more circuits may be adjusted in one or more subsequent fabrication steps so to alter the timing margin.

The delay circuit 130 may provide an adjustable delay to alter the timing margin between data strobe setup and data hold times for write operations, for example. The delay circuit 130 may include an array of delay unit circuits, with each delay unit circuit having a unique, different delay amount. Based on the determined timing margin, the internal connections of the delay circuit 130 may be changed based on selection of a different metallization mask at a corresponding fabrication step, for example. Changing the internal connections of the delay circuit 130 may adjust the actual timing margin to the desired timing margin. The delay circuit 130 is shown as a separate component within the memory 100, but this depiction is for ease of description. In some embodiments, the delay circuit 130 may be included in the IO circuit 128. The location of the delay circuit 130 and the number of delay circuits, however, is a non-limiting aspect of the present disclosure. Further, the discussion herein in terms of write operations and receiving write data should not be taken as limiting, and is discussed in such a manner for ease and consistency of description.

In a write operation, for example, the memory 100 may receive a write command and an associated address in which to store write data. Additionally, the memory 100 may receive the write data at the IO circuit 128 via the data pins DQ. The IO circuit 128 may capture the write data in response a data strobe signal DQS received by the IO circuit 128 via the DQS pin. The timing margin between the receipt of the write data and the capture of the write data based on the data strobe signal DQS may be determined by the delay circuit 130. It may be desirable, as in known in the art, to capture the write data at a moment that the data is most likely to be valid, e.g., in the middle of the timing window. The delay circuit 130 may be adjusted as mentioned to provide a desired timing margin.

In some embodiments, the delay circuit 130 may be used to delay the propagation of the strobe signal DQS within the IO circuit 128 with respect to the propagation of the write data, thereby delaying the capture of the write data. In some embodiments, there may be a plurality of delay circuits 130 so that the propagation of the write data in the IO circuit 128 is delayed with respect to the strobe signal. For example, there may be a delay circuit 130 corresponding to each data pin DQ. In this embodiment, each of the plurality of delay circuits 130 may have a different delay amount. In yet another embodiment, there may be a delay circuit 130 associated with each data pin DQ and one associated with the strobe signal pin DQS, with each of the delay circuits 130 being capable of having different delay amounts. In all embodiments, however, the timing margin may be adjusted so that the write data, for example, is captured at a desired time with respect to receiving the write data and/or the strobe signal.

Figure 2:
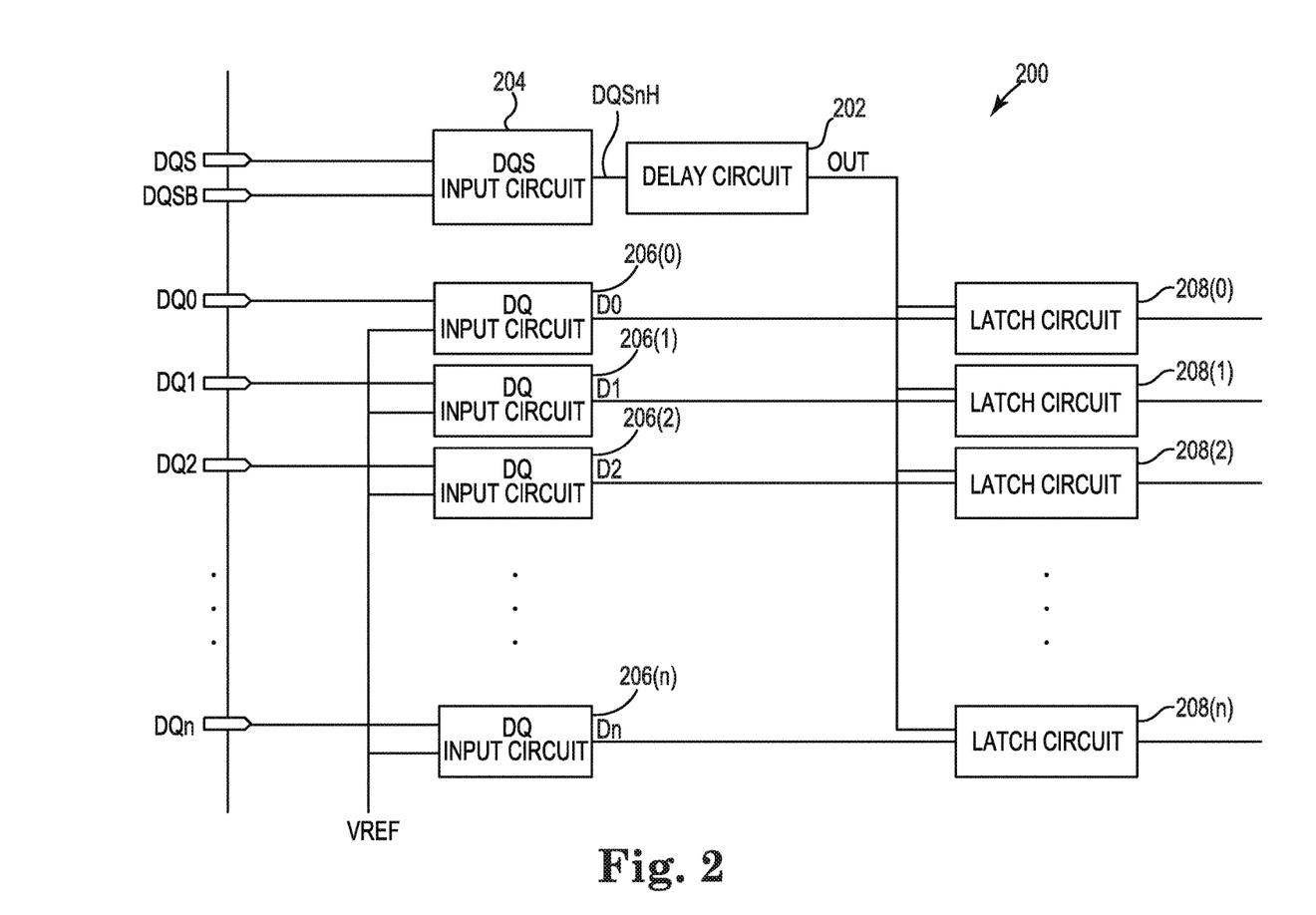
FIG. 2 is a block diagram of an input circuit according to an embodiment of the present disclosure.

FIG. 2 is a block diagram of an input circuit 200 according to an embodiment of the present disclosure. The input circuit 200 may be an example of the 10 circuit 128 of FIG. 1 and may include an example of the delay circuit 130. The input circuit 200 may include a DQS input circuit 204, a delay circuit 202, a plurality of DQ input circuits 206, such as the DQ input circuits 206(0)-206(n), and a corresponding plurality of latch circuits 208, such as the latch circuits 208(0)-208(n). The input circuit 200 may receive write data from a host, for example, and capture the write data based on a received data strobe signal(s). In the present embodiment, the data strobe signal is represented by differential strobe signals DQS and DQSB, but the differential-nature of the strobe signal is a non-limiting aspect of the present disclosure. The write data may be received on the input pins DQ0-DQ1, and the data strobe signals DQS and DQSB may be received on associated input pins DQS and DQSB. The delay circuit 202 may delay the output signal of the DQS input circuit 204, such as the internal data strobe signal DQSnH, and provide an output signal OUT in response. The output signal OUT may be provided to the plurality of latch circuits 208 to cause the plurality of latch circuits to capture the write data. For example, the OUT signal may be received at a clock input of each of the plurality of latch circuits 208 to cause each of the plurality of latch circuits 208 to latch respective bits of the write data.

The delay amount of the delay circuit 202 may have been adjusted during fabrication of a memory so that a desired timing margin is obtained. For example, the desired timing margin may cause the write data to be latched at a time when the write data is more than likely valid. For example, the delay amount of the delay circuit 202 may be selected so that the OUT signal causes the plurality of latches to capture respective bits of the write data in the middle of the timing window.

In the embodiment of FIG. 2, the DQS input circuit 204 may be coupled to data strobe signal input pins DQS and DQSB, and may receive differential strobe signals DQS and DQSB on the corresponding input pins. In response to receiving the differential strobe signals DQs and DQSB, the DQS input circuit 204 may provide the data strobe signal DQSnH to each of the plurality of latch circuits 208. The plurality of DQ input circuits 206 may be coupled to respective DQ input pins, and may also receive a reference voltage VREF. For example, DQ input circuit 206(0) may be coupled to DQ input pin DQ0, DQ input circuit 206(1) may be coupled to DQ input pin DQ1, and so on through to DQ input circuit 206(n) being coupled to DQ input pin DQn. Each of the plurality of DQ input circuits may receive a respective bit of write data, for example, and may provide the respective bit of the write data to a respective one of the plurality of latch circuits 208 in response. In some embodiments, each of the plurality of DQ input circuits may convert a voltage level of the received bit of write data to an internal voltage used by a host memory to represent the same logic state level as the received bit.

Each of the plurality of latch circuits 208 may be coupled to a respective one of the plurality of DQ input circuits 206. For example, the latch circuit 208(0) may be coupled to the DQ input circuit 206(0), the latch circuit 208(1) may be coupled to the DQ input circuit 206(1), and so on through to the latch circuit 208(n) being coupled to the DQ input circuit 206(n). A data input of each of the plurality of latches 208 may be coupled to an output of a respective one of the plurality of DQ input circuits 206. Additionally, each of the plurality of latch circuits 208 may be coupled to the delay circuit 202, such that the output signal OUT is received at a clocking input of each of the plurality of latch circuits 208. Each of the plurality of latch circuit 208 may latch and provide a respective bit of write data, e.g., capture the write data.

In operation, write data and data strobe signals may be received on respective data pins DQ and data strobe pins DQS/DQSB. Upon receiving the write data, each of the plurality of DQ input circuits 206 may convert a respective bit of the write data to an internal voltage level based on a logic state of the bit of write data, and provide the respective bit to a respective one of the plurality of latch circuits 208. Additionally, in response to receiving the data strobe signals DQS and DQSB, the DQS input circuit may provide the data strobe signal DQSnH signal to the delay circuit 202. The delay circuit 202 may then delay the strobe signal by a delay amount, then provide the OUT signal to each of the plurality of latch circuits 208 so that the write data is latched, e.g., captured, at a time based on a desired timing margin.

Figure 3:
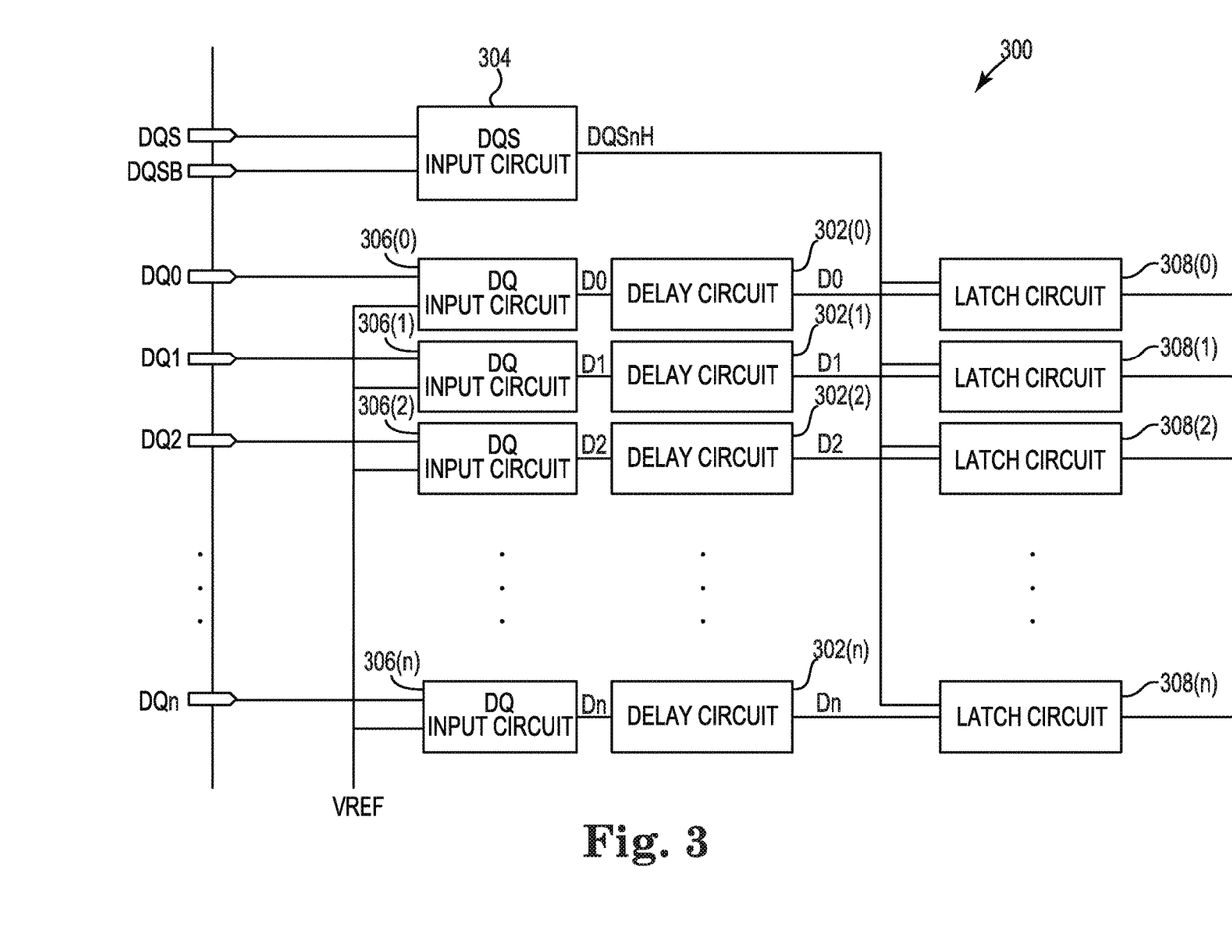
FIG. 3 is a block diagram of an input circuit according to an embodiment of the present disclosure.

FIG. 3 is a block diagram of an input circuit 300 according to an embodiment of the present disclosure. The input circuit 300 may be an example of the input circuit 128 of FIG. 1, and may further include a plurality of example delay circuits 130. The input circuit 300 may include a DQS input circuit 304, a plurality of DQ input circuits 306, such as the input circuits 306(0)-306(n), a plurality of latch circuits 308, such as the latch circuits 308(0)-308(n), and a plurality of delay circuits 302, such as the delay circuits 302(0)-302(n). The input circuit 300 may receive write data, for example, and data strobe signals DQS and DQSB, and capture the write data in response to the data strobe signals. The input circuit 300 may be similar to the input circuit 200 in the aspect that the timing margin may have been adjusted during fabrication of the input circuit 300 by adjusting a delay amount of one or more of the plurality of delay circuits 302. In the embodiment of the input circuit 300, the bit of write data may be provided to respective ones of the plurality of latch circuits 308 so that the write data is latched, e.g., captured, at a time when it is most likely valid with respect to the data strobe signal DQSnH clocking the plurality of latch circuits 308. In some embodiments, each of the plurality of delay circuits 302 may have the same delay amounts. In some embodiments, one or more delay circuit of the plurality of delay circuits 302 may have different delay amounts.

In the embodiment of FIG. 3, the DQS input circuit 304 may be coupled to data strobe signal input pins DQS and DQSB, and may receive differential data strobe signals DQS and DQSB on the corresponding input pins. In response to receiving the differential data strobe signals DQS and DQSB, the DQS input circuit may provide the internal strobe signal DQSnH. The internal strobe signal DQSnH may be provided to each of the plurality of latch circuits 308, which may cause each of the plurality of latch circuits 308 to latch, e.g., capture, respective bits of the write data provided by a respective one of the plurality of delay circuits 302. Each of the plurality of latch circuits 308 may then provide a respective bit of the write data to a host memory, for example.

The plurality of DQ input circuits 306 may be coupled to respective DQ input pins, and may also receive a reference voltage VREF. Each of the plurality of DQ input circuits may convert a received bit of write data into an internal voltage level that represents the logic state of the bit. For example, a bit received at a high voltage with respect to VREF may be converted to VREF, which may represent a high logic state, e.g., a "1." For a low logic state, the bit may be represented by a ground voltage. Each of the plurality of DQ input circuits 306 may, in response, provide a respective data bit to a respective one of the plurality of delay circuits 302. For example, the DQ input circuit 306(0) may provide a data bit D0 to the delay circuit 302(0).

Each of the plurality of delay circuits 302 may receive a respective data bit from a respective one of the plurality of DQ input circuits 306 and delay the propagation of the respective bit before providing the data bit to a respective one of the plurality of latches 308. The delay amount of each of the plurality of delay circuits 302 may have been adjusted during fabrication so that a desired timing margin is obtained by the input circuit 300. The delay amount of each of the plurality of delay circuits 302 may delay the arrival of their respective data bit to the respective one of the plurality of latch circuits 308 with respect to the arrival of the internal strobe signal DQSnH to each of the plurality of latch circuits 308. By adjusting the delay of one or more of the plurality of delay circuits 302, the timing margin may be adjusted so that the plurality of latches are clocked, e.g., triggered, at a time when the data provided by the plurality of delay circuits is most likely valid, e.g., at a midpoint of a timing window. As noted, each of the plurality of delay circuits 302 may have the same delay, or one or more delay circuits of the plurality of delay circuits 302 may have a different delay.

Figure 4:
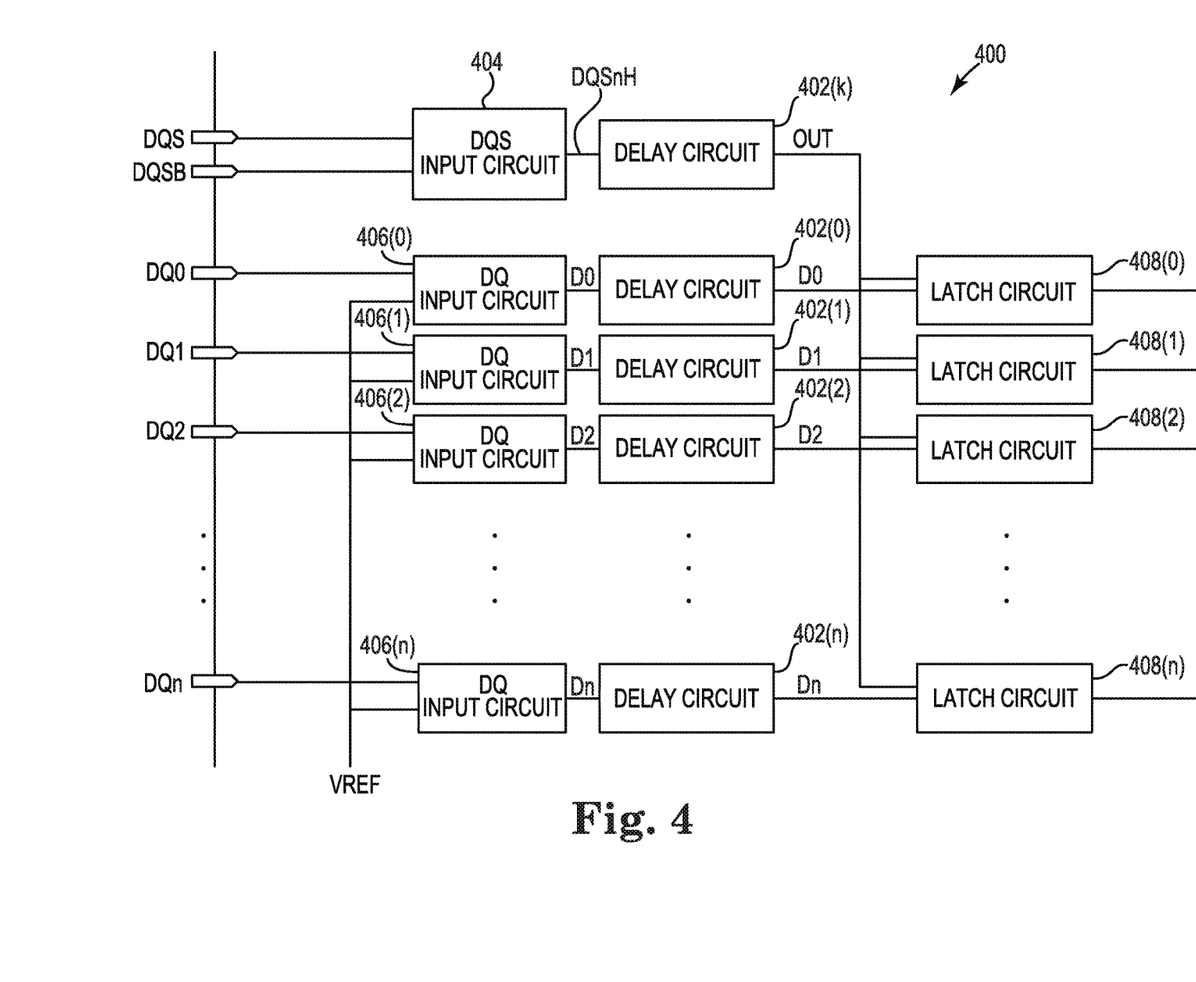
FIG. 4 is a block diagram of an input circuit according to an embodiment of the present disclosure.

FIG. 4 is a block diagram of an input circuit 400 according to an embodiment of the present disclosure. The input circuit 400 may be an example of the IO circuit 128 of FIG. 1, and may include examples of the delay circuit 130. The input circuit 400 may include a DQS input circuit 404, a plurality of DQ input circuits 406, such as the DQ input circuits 406(0)-406(n), a plurality of latch circuits 408, such as the latch circuits 408(0)-408(n), and a plurality of delay circuits 402, such as the delay circuits 402(0)-402(n) and the delay circuit 402(k). The input circuit 400 may be an example combination of the input circuits 200 and 300. As such, a full discussion regarding the input circuit 400 is omitted for sake of brevity. The input circuit 400 may be configured to receive write data from a host, for example, and capture the write data in accordance with a desired timing margin. The timing margin, as noted herein, may be based on a relative timing of the data strobe signal and the data signals. During fabrication of the input circuit 400, for example, each of the plurality of delay circuits 400 may have had a respective delay amount adjusted to provide the desired timing margin.

The input circuit 400 may include respective ones of the plurality of delay circuits 402 for both the DQS input circuit 404 and the plurality of DQ input circuits 406. As such, both the internal strobe signal DQSnH and the data bits D0-Dn may be delayed a respective delay amount before the write data is captured by a respective one of the plurality of latch circuits 408. In some embodiments, each of the plurality of delay circuits 402 may be adjusted to have the same delay amount. In some embodiments, one or more delay circuits of the plurality of delay circuits 402 may be adjusted to have different delay amounts.

Figure 5:
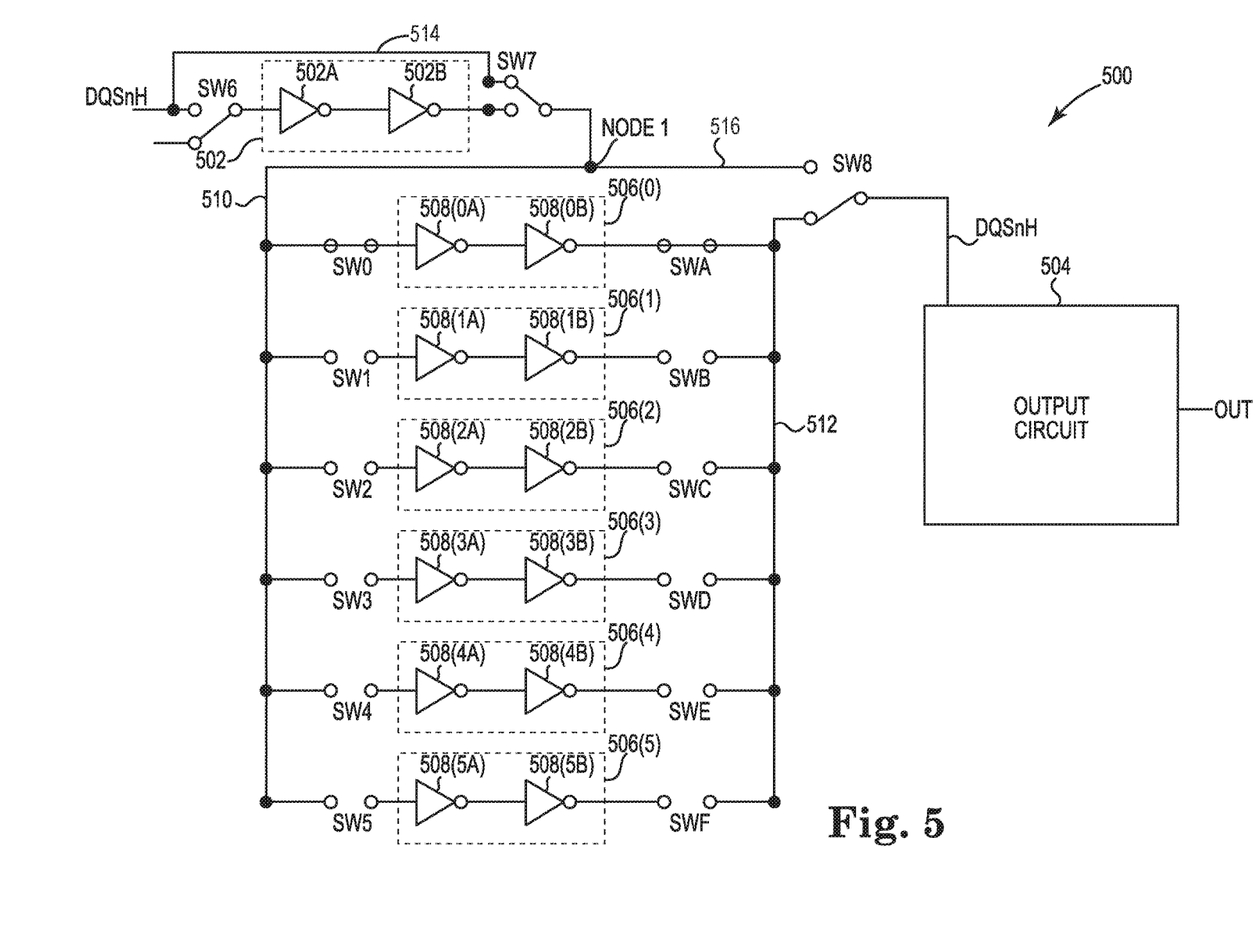
FIG. 5 may be a schematic of a delay circuit according to an embodiment of the present disclosure.

FIG. 5 may be a schematic of a delay circuit 500 according to an embodiment of the present disclosure. The delay circuit 500 may be an example delay circuit 130 of FIG. 1, and may also be an example of the delay circuits included in the input circuits 200, 300, and 400. The delay circuit 500 may include a delay unit circuit 502, a plurality of delay unit circuits 506, such as the delay unit circuits 506(0)-506(5), and an output circuit 504. While the delay circuit 500 is shown to have seven delay unit circuits, the number of delay unit circuits is a non-limiting factor of the present disclosure. In some embodiments, the number of delay unit circuits may be greater than or fewer than seven. A characteristic delay amount of the delay circuit 500 may be adjusted to provide a delay amount that may result in a desired timing margin of a host memory being obtained. The delay circuit 500 may be configured substantially similar to the depiction shown in FIG. 5.

The delay unit 502 may include two series-coupled inverters, such as inverters 502A and 502B. Each of the inverters 502A, B may be formed by an n-channel and a p-channel transistor, as is known in the art. The transistors of the two inverters 502A, B may have a channel width and a channel length. The dimensions of the channel width and/or length may affect a delay amount of each inverter 502A, B. The delay of the inverters 502A, B may determine a delay amount of the delay unit 502. Thus, a desired delay of the delay unit 502 may be obtained by selecting a channel length, for example, that results in the desired delay amount. A channel width may be selected based on fabrication parameters, for example, and may be the same for all transistors of the input circuit 500. For example, at a given channel width, varying the channel length may provide a corresponding delay amount. For example, at the given channel width, a transistor with a channel length of 114 nanometers (nm) may have a longer delay than a transistor with a channel length of 94 nm. In some embodiments, the delay unit 502 may be designed to provide a desired delay amount to meet a desired timing margin.

Each of the plurality of delay unit circuits 506 may include two series-coupled inverters. For example, the delay unit 506(0) may include the inverters 508(0A) and 508(0B). The number of series-coupled inverters is a non-limiting aspect of the present disclosure and each delay unit circuit may have fewer or greater numbers of inverters. Also as discussed above, each of the inverters 508(0A) through 508(5B) may be formed from an n-channel transistor and a p-channel transistor. Each transistor may also have its own channel width and length, which may be selected based on design and/or fabrication parameters. For ease of discussion, the channel width for all transistors will be the same, which may be selected based on a fabrication parameter, for example. The channel length of the transistors of each of the plurality of delay unit circuits 506, may be unique and different. For example, the transistors forming the inverters of each of the plurality of delay units 506 may have different channel lengths than the transistors of the other delay units. For example, the transistors forming the two inverters 508 (0A) and 508 (0B) may have the same channel length, 114 nm for example, and the inverters 508(1A) and 508 (1B) may have the same channel length, 104 nm for example. Accordingly, in some embodiments, the channel length of respective transistors may be successively shorter as you progress through the delay unit circuits 506 starting at delay unit circuit 506(0) and ending at delay unit circuit 506(5). Further, as noted above, the channel length may be indicative of a delay amount and the two parameters may positively change with each other. For example, a relatively long channel length may provide a relatively long delay amount, whereas a relatively short channel length may provide a relatively short delay amount. As such, each of the plurality of delay unit circuits 506 may be characterized as having different delays since each of the delay units may be formed from transistors having different channel lengths. For example, a delay of the delay unit 506(0) may be larger than a delay of the delay unit 506(1), the delay of delay unit 506(1) may be larger than a delay of the delay unit 506(2), and so on. Accordingly, the delay unit circuit 506(0) may have the longest delay amount and the delay unit circuit 506(5) may have the shortest delay amount.

The delay circuit 500 may be configured as shown in FIG. 5, but the configuration shown in FIG. 5 should not be considered a limiting aspect of the present disclosure. The delay circuit 500 may receive a data strobe signal DQSnH at a switch SW6. Depending on the position of SW6, the data strobe signal may propagate through connection line 514 or through the delay unit 502 to a next switch SW7. The positions of SW7 may select whether the data strobe signal provided to a NODE 1 may be provided by connection line 514 or the delay unit 502. The path from NODE 1 of the data strobe signal may be determined by a position of switch SW8. For example, if SW8 is in a position coupling connection line 516 to an input of the output circuit 504, then the data strobe signal may propagate from NODE 1 to the output circuit. If, however, SW8 is in a position coupling connection line 512 to the input of the output circuit 504, then the data strobe signal may propagate along connection line 510. The connection line 510 may be coupled to a plurality of switches SW0-SW5, which may correspond to respective ones of the plurality of delay units 506. For example, as shown in FIG. 5, the switch SW0 may be closed to couple the connection line 510 to an input of the delay unit 506(0). Additionally, outputs of each of the plurality of delay units 506 may be coupled to the connection line 512 through a respective on of the plurality of switches SWA-SWF. For example, the switch SWA may be closed to couple an output of the delay unit 506(0) to the connection line 512.

As discussed above, during fabrication memories may be tested to determine whether a desired timing margin is being met. A delay amount of the delay unit circuit 502 may be selected to provide the desired timing margin for a host input circuit. However, if the delay amount provided by the delay unit 502 is not commensurate with the desired delay amount, the connections of the various switches of the delay circuit 500 may be altered during fabrication to adjust the delay amount of the delay circuit 500. A memory of the delay circuit 500 may be tested during fabrication to determine if the desired timing margin is being provided. If not, a determination of how to adjust a delay amount of the delay circuit 500 may be made and a corresponding one of the plurality of delay unit circuits 506 may be selected. The range of delay amounts the plurality of delay unit circuits 506 may provide may straddle a delay amount of the delay unit circuit 502 so that the delay of the delay circuit 500 may be larger or lesser relative to the delay of the delay unit circuit 502. To adjust the delay amount of the delay circuit 500, the state of the various switches SW0-SW8 and SWA-SWF may be changed, e.g., connected or disconnected, so that the data strobe signal propagates through a desired one of the plurality of delay unit circuits 506. If however, the test determines the timing margin is as desired, the delay circuit 500 may be fabricated so that the data strobe signal DSQnH propagates through the delay unit circuit 502 to the output circuit 504.

If however, the tested timing margin is not as desired, the connections of the various switches of the delay circuit 500 may be adjusted so that the data strobe signal propagates through one of the plurality of delay unit circuits 506. For example, the position of SW6 and SW7 may be changed so that the data strobe signal bypasses the delay unit circuit 502 and propagates through the connection line 514 instead. Additionally, SW8 may be changed so that the connection line 512 is coupled to the input of the output circuit 504. Further, depending on the selected delay amount, one of the switches SW0-5 and a corresponding one of the switches SWA-F may be connected so that the data strobe signal propagates through a corresponding one of the plurality of delay unit circuits 506. The remaining switches may remain disconnected. For example, switches SW0 and SWA may be closed while the remaining switches SW1-5 and SWB-F remain open so that the data strobe signal propagates through the delay unit circuit 506(0). As noted above, the delay unit circuit 506(0) may provide a different delay amount than each of the other delay unit circuits 506(1)-506(5) and also the delay unit circuit 502. Thus, by adjusting the propagation path the data strobe signal takes through the delay circuit 500, the delay amount of the delay circuit 500 may be adjusted. Further, adjusting the delay amount of the delay circuit 500 may adjust the timing margin of a memory, for example.

Figure 6:
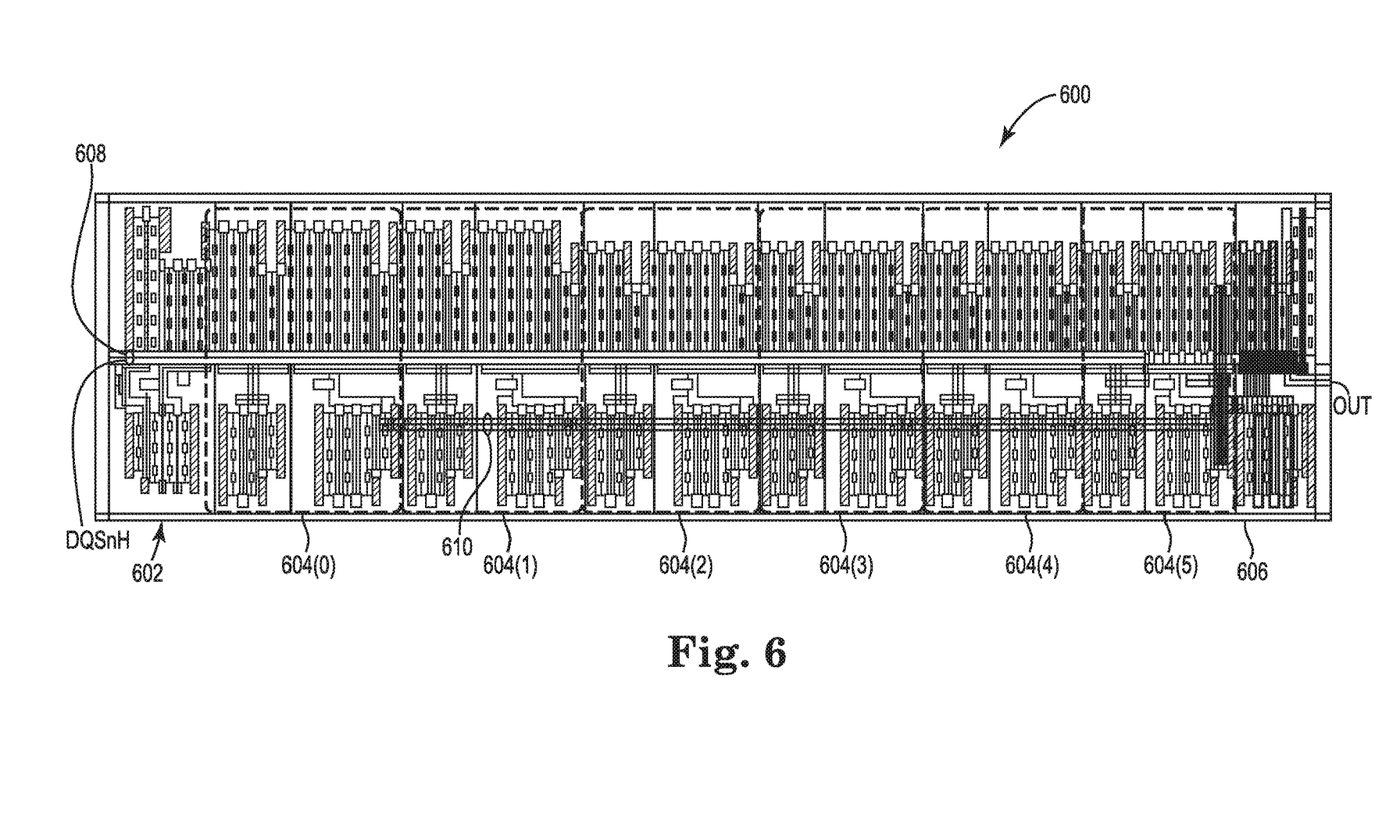
FIG. 6 is an example layout of a delay circuit in accordance with an embodiment of the present disclosure.

FIG. 6 is an example layout 600 of a delay circuit in accordance with an embodiment of the present disclosure. The layout 600 may be an example mask layout for fabricating the delay circuit 500. The layout 600 may be used for implementing a "metal option" fabrication process to couple a desired delay unit circuit between an input and an output of an adjustable delay circuit, for example. In some embodiments, the metal option fabrication process may allow changes to circuit connections within a semiconductor die to be implemented during fabrication. The layout 600 may include a delay unit circuit 602, a plurality of delay unit circuits 604, such as the delay unit circuits 604(0)-604(5), and an output circuit 606. The layout 600 further includes an input electrical connection line 608, and an output electrical connection line 610. The connection lines 608 and 610 may be electrical traces in some embodiments. The layout 600 may be used to alter the connections of a delay circuit, such as to connect switches as discussed above with regards to FIG. 5, so that a delay unit circuit of a desired delay amount may be coupled between the input electrical connection line 608 and the output electrical connection line 610.

The layout 600 may be arranged so that the plurality of delay units 604 are in decreasing delay amount between the delay unit 602 and the output circuit 606. For example, the delay of delay unit 604(0) may be larger than the delay of delay unit 604(1), which may be larger than the delay of delay unit 604(2), and so on so that the delay unit 604(5) may have the shortest delay amount. Because of the relation between delay amount and channel length, the channel lengths of the transistors forming each of the plurality of delay units 604 may be similarly related in arrangement. For example, the channel length of the transistors forming the delay unit 604(0) may be longer than the channel length of the transistors forming the delay unit 604(1), and so on so that the channel length of the transistors forming the delay unit 604(5) may be the shortest. Stated another way, the respective delay amounts of the plurality of delay unit circuits 604 may become larger as you move down the line of delay unit circuits 604 away from the output circuit 606. Conversely, the respective delay amounts become smaller as you move down the line of delay unit circuits 604 toward the output circuit 606.

Further, the layout 600 depicts the plurality of delay elements being arranged in a line between the delay unit 602 and the output circuit 606, so that each successive delay unit 604 is sandwiched between two surrounding delay units with the last delay unit 604(5) sandwiched between the delay unit 604(4) and the output circuit 606. Further, the delay unit circuit 604(0) may be adjacent to the delay unit circuit 602, and the delay unit circuit 604(5) may be adjacent to the output circuit 606, with the intervening delay unit circuits 604(1)-(4) arranged in between the delay unit circuits 604(0) and 604(5). The line of delay circuits 604 may end adjacent to the output circuit 606, which may not be sandwiched between any two of the plurality of delay unit circuits 604.

To adjust a delay amount of a delay circuit based on the layout 600, one of the delay unit circuits 604 may be selected and an input of a first inverter may be coupled to the input connection line 608, and an output of a second inverter may be coupled to the output connection line 610. As discussed above and will be shown in more detail below with regards to FIG. 7, each of the delay unit circuits 604 may be formed from two series coupled inverters, with each of the inverters formed from an n-channel and a p-channel transistor configured as is known in the art.

Figure 7:
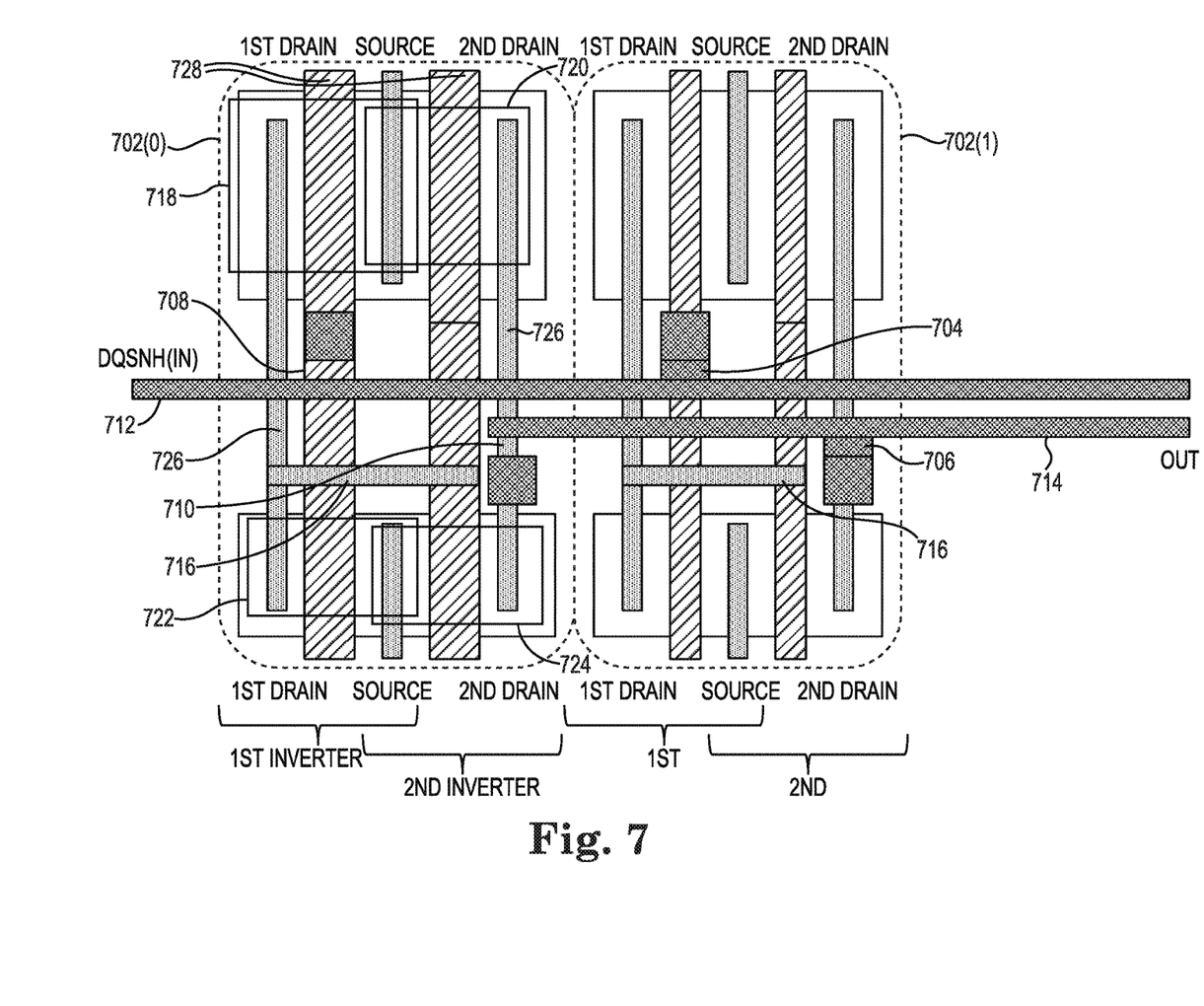
FIG. 7 is an example layout of two delay unit circuits in accordance with an embodiment of the present disclosure.

FIG. 7 is an example layout 700 of two delay unit circuits in accordance with an embodiment of the present disclosure. The layout 700 may show two delay unit circuits 702, such as delay unit circuits 702(0) and 702(1). The delay unit circuits 702 may be examples of two of the plurality of delay unit circuits 604 of FIG. 6. The two delay unit circuits 702 may each provide a different delay amount, which may be due to different channel lengths of the transistors forming the delay units 702. A propagation delay of the data strobe signal DQSnH may be based on which of the two delay units 702 may be coupled between an input electrical connection line 712 and an output electrical connection line 714.

The delay unit circuit 702(0) may be formed from two inverters, which are themselves formed from two transistors. For example, the delay unit 702(0) may be formed from a first invertor and a second invertor. The first invertor may be formed from a p-channel transistor 718 and an n-channel transistor 722, with each transistor including a first drain, a gate, and a source. The second invertor may be formed from a p-channel transistor 720 and an n-channel transistor 724, with each of the transistors including a second drain, a gate, and the source. Each of the transistors 718, 720, 722, and 724 may have the same gate width and the same gate length. The delay unit 702(1) may be substantially the same as the delay unit circuit 702(0) except the channel length of the transistors forming the delay unit circuit 702(1) may be different than the channel length of the transistors forming the delay unit circuit 702(0). In some embodiments, the channel length of the transistors forming the delay unit circuit 702(1) may be shorter than the channel lengths of the transistors forming the delay unit circuit 702(0). In some embodiments, the channel length of the transistors forming the delay unit circuit 702(1) may be longer than the channel lengths of the transistors forming the delay unit circuit 702(0).

To form the first invertor of the delay unit circuit 702(0), the first drains of the p-channel and n-channel transistors 718 and 722, respectively, may be coupled by a drain connection line 726. Additionally, gates of the p-channel and n-channel transistors 718 and 722, respectively, may be coupled by a gate connection line 728. The sources of the p-channel and n-channel transistors 718 and 722, respectively, may be coupled to supply voltages. The second invertor may be similarly arranged. The two inverters of the delay unit circuit 702(0) may be coupled together from the drains of the first invertor to the gates of the second invertor by the connection line 716. Accordingly, the layout of the transistors of the delay unit circuit 702(0) as depicted in FIG. 7 may be an example layout of two series-coupled inverters.

To couple one of the delay units 702 to the electrical connection lines 712 and 714, a metallization mask may be selected during fabrication that provides a first metallization coupling between a first gate connection line 728 and a second drain connection line 726 to the electrical connection lines 712 and 714, respectively. For example, the first gate connection of the delay unit 702(1) may be coupled to the electrical connection line 712 via the metal wiring 704, e.g., at an input node, and the second drain connection of the delay unit 702(1) may be coupled to the electrical connection line 714 via the metal wiring 706, e.g., an output node. As depicted in FIG. 7, the delay unit circuit 702(0) is disconnected from the electrical connection lines 712 and 714 since there are no electrical connections made at locations 708 and 710. Thus, by selecting the metallization mask, a specific delay unit of a delay circuit may be coupled between the input and the output.

The foregoing disclosure describes examples of adjustable delay circuits that may be included in memory IO circuits, for example. The example adjustable delay circuits may be adjusted during fabrication from a designed delay amount to a different delay amount by changing electrical connections to alter a propagation path, and thus delay, of a data signal and/or a data strobe signal. The change in delay may further adjust a timing margin of a data capture process of a memory.

What is claimed is:

1. An apparatus, comprising:
   a signal line supplied with a signal;
   an output circuit; and
   a plurality of delay circuits each including an input node, an output node and a same number of transistors between the input node and the output node, and wherein a selected one of the plurality of delay circuits being connected at its input node to the signal line and at its output node to the output circuit with any of the input and output nodes of any one of the rest of the plurality of delay circuits being disconnected from any one of the signal line and the output circuit.

2. The apparatus of claim 1, wherein the plurality of delay circuits include first transistors, each of the first transistors having a different channel length from another first transistor.

3. The apparatus of claim 2, wherein each of the first transistors corresponds to a first type of channel transistor, wherein the plurality of delay circuits include second transistors, each of the second transistors having a different channel length from another second transistor, and wherein each of the second transistors corresponds to a second type of channel transistor.

4. The apparatus of claim 3, wherein the first transistors are substantially the same in channel width as each other and the second transistors are substantially the same in channel width as each other.

5. The apparatus of claim 1, wherein the output circuit and the plurality of delay circuits are arranged in line without the output circuit being sandwiched between any adjacent two of the delay circuits, and wherein the plurality of delay circuits are configured to provide respective delay amounts that become larger when further in distance from the output circuit.

6. The apparatus of claim 1, each of the delay circuits of the plurality of delay circuits is configured to provide a respective delay amount that is different from another delay amount of another delay circuit of the plurality of delay circuits.

7. The apparatus of claim 1, wherein one of the plurality of delay circuits is disposed adjacent to the output circuit in a layout for a semiconductor die, the one delay circuit having a smaller delay amount than other delay amounts of other ones of the plurality of delay circuits.

8. An apparatus, comprising:
a plurality of delay circuits, wherein each of the plurality of delay circuits includes a same number of transistors, and the plurality of delay circuits are arranged in a layout for a semiconductor die along a line between an input circuit and an output circuit, wherein the plurality of delay circuits are configured to be limited to having only one of the plurality of delay circuits coupled between an input connection line and an output connection line to provide a delayed signal to the output connection line, wherein the delayed signal has a delay relative to an input signal provided to the input connection line, and wherein remaining ones of the plurality of delay circuits are disconnected from both the input connection line and the output connection line.

9. The apparatus of claim 8, wherein a data strobe signal is provided on the input connection line and delayed an amount based on the delay circuit of the plurality of delay circuits coupled between the input connection line and the output connection line.

10. The apparatus of claim 8, wherein each of the plurality of delay circuits are formed from a plurality of series-coupled inverters.

11. The apparatus of claim 8, wherein the plurality of delay circuits are configured to provide respective delay amounts that become larger when further in distance from the output circuit.

12. An apparatus, comprising:
a first input circuit configured to receive at least one data strobe signal and to output an internal data strobe signal;
a delay circuit configured to receive the internal data strobe signal and to output a delayed internal data strobe signal;
a second input circuit configured to receive a data signal and to output an internal data signal; and
a latch circuit configured to latch the internal data signal in synchronism with the delayed internal data strobe signal;
wherein the delay circuit comprises:
a signal line supplied with the internal data strobe signal;
an output circuit configured to output the delayed internal data strobe signal; and
a plurality of delay circuits each including an input node and an output node, and a selected one of the plurality of delay circuits being connected at its input node to the signal line and at its output node to the output circuit with any of the input and output nodes of any one of the rest of the plurality of delay circuits being disconnected from any one of the signal line and the output circuit.

13. The apparatus of claim 12, further comprising:
an additional delay circuit coupled between the second input circuit and the latch circuit to transmit a delayed internal data signal as the internal data signal to the latch circuit.

14. The apparatus of claim 13, further comprising:
a third input circuit configured to receive an additional data signal and to output an additional internal data signal; and
an additional latch circuit configured to latch the additional data signal in synchronization with the delayed internal data strobe signal.

15. The apparatus of claim 13, wherein the additional delay circuit comprises:
an additional signal line supplied with the internal data signal from the second input circuit; and
an additional output circuit configured to output the delayed internal data signal to the latch circuit.

16. The apparatus of claim 15, wherein the additional delay circuit further comprises:
a plurality of additional delay circuits, each of the plurality of additional delay circuits including an additional input node and an additional output node, and a selected one of the plurality of additional delay circuits being connected at its additional input node to the additional signal line and at its additional output node to the additional output circuit with any of the additional input and output nodes of any one of the rest of the plurality of additional delay circuits being disconnected from any one of the additional signal line and the additional output circuit.

17. The apparatus of claim 16, wherein the plurality of additional delay circuits include first transistors, each of the first transistors having a different channel length from another first transistor.

18. The apparatus of claim 17, wherein each of the first transistors corresponds to a first type of channel transistor, wherein the plurality of additional delay circuits include second transistors, each of the second transistors having a different channel length from another second transistor, and wherein each of the second transistors corresponds to a second type of channel transistor.

19. The apparatus of claim 12, each of the delay circuits of the plurality of delay circuits is configured to provide a respective delay amount that is different from another delay amount of another delay circuit of the plurality of delay circuits.

20. The apparatus of claim 12, wherein one of the plurality of delay circuits is disposed adjacent to the output circuit in a layout for a semiconductor die, the one delay circuit having a smaller delay amount than other delay amounts of other ones of the plurality of delay circuits.

* * * * *